(12) United States Patent
Yamamoto (10) Patent No.: US 9,425,439 B2
(45) Date of Patent: Aug. 23, 2016

(54) ORGANIC ELECTROLUMINESCENT MODULE AND METHOD OF MANUFACTURING THE SAME

(71) Applicant: Konica Minolta, Inc., Tokyo (JP)

(72) Inventor: Natsuki Yamamoto, Kawasaki (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/747,649

(22) Filed: Jun. 23, 2015

(65) Prior Publication Data

US 2016/0027860 A1 Jan. 28, 2016

(30) Foreign Application Priority Data

Jul. 23, 2014 (JP) ................... 2014-149602

(51) Int. Cl.
*H01L 51/56* (2006.01)
*H03K 17/96* (2006.01)
*H05K 1/18* (2006.01)

(52) U.S. Cl.
CPC ........... *H01L 51/56* (2013.01); *H03K 17/9622* (2013.01); *H05K 1/189* (2013.01); *H03K 2217/960755* (2013.01); *H03K 2217/960795* (2013.01); *H05K 2201/053* (2013.01); *H05K 2201/056* (2013.01); *H05K 2201/10106* (2013.01)

(58) Field of Classification Search
CPC ............. H03K 17/9622; H03K 2217/960755; H03K 2217/960795; H05K 1/189; H05K 2201/053; H05K 2201/056; H05K 2201/10106; H05K 3/326
See application file for complete search history.

(56) References Cited

U.S. PATENT DOCUMENTS

| | | | |
|---|---|---|---|
| 2006/0097364 A1* | 5/2006 | Shinojima | G02F 1/13452 257/666 |
| 2014/0111953 A1* | 4/2014 | McClure | G06F 3/044 361/749 |
| 2014/0285466 A1* | 9/2014 | Hayashi | G06F 3/044 345/174 |

FOREIGN PATENT DOCUMENTS

JP 2012194291 A 10/2012

* cited by examiner

*Primary Examiner* — Erik Kielin
(74) *Attorney, Agent, or Firm* — Lucas & Mercanti, LLP

(57) ABSTRACT

An organic electroluminescent module of the present invention includes an organic EL panel and an electrical connection unit. The electrical connection unit includes a flexible substrate including a body disposed adjacent to a light-emitting surface of the organic EL panel, and a contact piece defined by a cutout in the body and disposed remote from the light-emitting surface of the organic EL panel; a capacitance sensing circuit and drive circuits formed on a surface of the body; lands formed on a surface of the contact piece; and metal layers formed on a surface of the contact piece in portions overlapping with the lands.

6 Claims, 3 Drawing Sheets

ORGANIC ELECTROLUMINESCENT MODULE AND METHOD OF MANUFACTURING THE SAME

BACKGROUND OF THE INVENTION

1. Field of the Invention

The present invention relates to an organic electroluminescent module and a method of manufacturing the same, particularly to an organic electroluminescent module that can be readily manufactured and has high accuracy of touch sensing and a method of manufacturing the same.

2. Description of Related Art

Examples of traditional planar light sources include light emitting diodes (LEDs) provided with lightguide plates and organic light emitting diodes (OLEDs) (hereinafter also referred to as "organic electroluminescent element").

Since about 2008, the use of LED light sources provided with lightguide plates, which have been typically used as illuminating lamps for general use, has been rapidly spread to the backlights of main displays (e.g., liquid crystal displays (LCDs)) for smart devices (e.g., smartphones and tablets) which have been widely used around the world.

LED light sources, which are used as backlights for main displays, are also used as backlights for common function key buttons provided in lower portions of smartphones.

Some common function key buttons are provided with three marks indicating "Home" (e.g., represented by a square mark) "Back" (e.g., represented by an arrow mark), and "Search" (e.g., represented by a magnifier mark).

In view of high visibility, such common function key buttons are provided with LED light sources with lightguide plates. Such a lightguide plate has a dotted polarizing pattern conforming to the pattern of the mark to be displayed and has LED light sources at the edges. The LED light sources emit light on the side surfaces of the lightguide plate. Light from the LED light sources enters the lightguide plate from the side surfaces and then is totally reflected on the reflection surface of the polarizing pattern toward the front of the lightguide plate. Consequently, light with a predetermined pattern is emitted from the front side of the lightguide plate, so that the viewer sees light with such a pattern when viewing the lightguide plate from the front (see Japanese Unexamined Patent Application Publication No. 2012-194291, for example).

Aside from this, use of surface-emitting organic electroluminescent (EL) panels has been studied to achieve low power consumption and uniform luminance. In use of such an organic EL panel, a cover glass with a printed mark on one surface is prepared and the organic EL panel is disposed on the other surface of the cover glass so as to overlap the printed mark for image display.

Smart devices require touch technology. For this reason, capacitance touch sensing devices are generally disposed on the rear surfaces of cover glasses for display areas and common function keys of smart device.

In many cases, touch sensing devices for such use each include two films having the same size as the cover glass. Touch sensing devices including two glass layers are also used in smart devices with unlimited thickness. Many of the current smart devices employ capacitive sensing technology. Main displays often employ "projected capacitive sensing technology" with an electrode pattern consisting of fine traces extending in x- and y-axis directions. This technology allows "multi-touch operation" where multiple touches can be detected at the same time.

With the use of such touch sensors, traditional common function keys are provided with light-emitting devices that cannot sense touch. The recent emergence of in-cell and on-cell displays, however, has brought a demand for common function keys with touch-sensible light-emitting devices.

Common function keys require surface capacitance technology that allows on/off detection, rather than multi-touch technology. The surface capacitance technology requires a simple solid electrode pattern for touch sensing.

Technology to provide a touch-sensible organic EL panel is also known in which a capacitance sensing circuit is integrated in a flexible printed circuit (FPC) designed to drive the organic EL panel.

A typical single-sided organic EL panel has an electrode to be electrically connected to the FPC. The electrode is on the opposite side to the light-emitting side of the organic EL panel, which means that the FPC is on the opposite side to the light-emitting side. If a capacitance sensing circuit is integrated in the FPC, the circuit is on the opposite side to the light-emitting side of the organic EL device (on the rear side of the organic EL device). In this configuration, the organic EL element has an anode, a cathode, and a protective metal layer in front of (more proximal to the light-emitting surface than) the sensing circuit. This hinders the sensing circuit from detecting variations in capacitance and decreases the accuracy of touch sensing.

One approach for solving such a problem is to form a contact piece by providing a cutout on the periphery of lands (to be electrically connected to the organic EL panel) of the FPC in such a manner that the FPC body with a sensing circuit is disposed on the light-emitting side of the organic EL device, while the contact piece is bent to be disposed on the opposite side of the organic EL device. This approach maintains high accuracy of touch sensing in the sensing circuit and enables connection between the FPC and contact electrodes on the back (on the opposite side of the light-emitting side) of the organic EL panel.

Unfortunately, manufacturing such an organic EL module requires the step of bending the module at a boundary between the FPC body and the contact piece to dispose the contact piece on the back of the organic EL panel, resulting in increased steps of manufacturing the organic EL module.

SUMMARY OF THE INVENTION

An object of the present invention, which has been made to solve the problem, is to provide an organic electroluminescent module that can be readily manufactured and exhibits high accuracy of touch sensing and a method of manufacturing the organic electroluminescent module.

The study of the cause of the problem to be solved in the present invention has arrived at a solution involving use of a difference between the curled states of the flexible substrate body and the contact piece of the electrical connection unit of the organic electroluminescent module and disposition of metal layers on the contact piece. The solution leads to ease of mounting of the organic electroluminescent panel on the electrical connection unit and connection therebetween.

To achieve at least one of the above-mentioned objects, according to a first aspect of the present invention, there is provided an organic electroluminescent module including: an organic electroluminescent panel; and an electrical connection unit disposed on a light-emitting side of the organic electroluminescent panel, the electrical connection unit including: a flexible substrate including:

a body disposed on the light-emitting side and periphery of the organic electroluminescent panel; and a contact piece defined by at least one cutout in the body and disposed on the opposite side to the light-emitting side of the organic electroluminescent panel; a capacitance sensing circuit disposed on one surface of the body; drive circuits disposed on the one surface of the body and configured to drive the organic electroluminescent panel; lands disposed on one surface of the contact piece and connecting the drive circuits to the organic electroluminescent panel; and metal layers disposed on the other surface of the contact piece in portions overlapping with the lands.

Preferably, the organic electroluminescent panel includes a pair of planar electrodes.

Preferably, the electrical connection unit includes a light-transmitting portion for transmission of light from the organic electroluminescent panel.

Preferably, the lands and the metal layers are composed of the same material.

Preferably, the organic electroluminescent module further includes contact electrodes disposed on the opposite side to the light-emitting side of the organic electroluminescent panel, wherein the lands of the contact piece are connected to the respective contact electrodes through an anisotropic conductive film, conductive paste, or metal paste.

Preferably, a method of manufacturing the organic electroluminescent module includes the steps of: forming, on one surface of the flexible substrate, a capacitance sensing circuit, drive circuits configured to drive the organic electroluminescent panel, and lands connecting the drive circuits to the organic electroluminescent panel; forming metal layers on the other surface of the flexible substrate in portions overlapping with the lands; fabricating the electrical connection unit by providing at least one cutout on the periphery of the lands of the flexible substrate, the cutout defining a body including the sensing circuit and the drive circuits and a contact piece including the lands and the metal layers; sliding the organic electroluminescent panel in the surface direction of the contact piece into a gap between the body and the contact piece of the flexible substrate; and bonding contact electrodes of the organic electroluminescent panel to the contact piece of the electrical connection unit by thermal compression.

The following explains the mechanisms that bring or affect the advantageous effects of the invention.

The body of the flexible substrate in the electrical connection unit has one surface on which a sensing circuit and drive circuits are disposed and the other surface without any such circuits. The flexible substrate, the sensing circuit, and the drive circuits have different coefficients of linear expansion, producing a difference between the coefficients of linear expansion of the two surfaces of the flexible substrate body. Thus, the finished electrical connection unit is curled such that one of these surfaces is a concave surface. In a combination of a polyimide flexible substrate, a copper sensing circuit, and copper drive circuits, the flexible substrate is curled such that the surface provided with the sensing circuit and the drive circuits is a concave surface. The contact piece has lands on one surface and metal layers on the other surface in portions overlapping with the lands. This configuration minimizes the difference between the coefficients of linear expansion of the two surfaces of the contact piece and thus the curl of the contact piece. This produces a difference between the curled levels of the flexible substrate body and the contact piece, resulting in a gap between the body and contact piece of the flexible substrate. An organic electroluminescent panel can be readily inserted in the gap. This facilitates mounting of the organic electroluminescent panel on the electrical connection unit without the step of bending the module at a boundary between the contact piece and the body.

In the step of applying pressure on the contact electrodes of the organic EL panel and the adjoining contact piece of the flexible substrate for mechanical and electrical connection therebetween, the pressures applied from two sides to the organic electroluminescent panel and the contact piece are eventually applied to the lands via the metal layers that reside on the other surface of the contact piece and overlap with the lands. Hence, the lands receive the pressure effectively and the pressure on the organic electroluminescent panel and the contact piece is minimized. This facilitates the connection between the organic electroluminescent panel and the contact piece. Moreover, the approach can minimize damage of the contact piece because a pressuring device comes into contact with the metal layers, not with the contact piece.

BRIEF DESCRIPTION OF THE DRAWINGS

The present invention will become more fully understood from the detailed description given hereinbelow and the appended drawings, and thus are not intended to define the limits of the present invention, and wherein.

PREFERRED EMBODIMENT OF THE PRESENT INVENTION

An organic electroluminescent module of the present invention includes: an organic electroluminescent panel; and an electrical connection unit disposed on a light-emitting side of the organic electroluminescent panel, the electrical connection unit including: a flexible substrate including: a body disposed on the light-emitting side and periphery of the organic electroluminescent panel, and a contact piece defined by at least one cutout in the body and disposed on the opposite side to the light-emitting side of the organic electroluminescent panel; a capacitance sensing circuit disposed on one surface of the body; drive circuits disposed on the one surface of the body and configured to drive the organic electroluminescent panel; lands disposed on one surface of the contact piece and connecting the drive circuits to the organic electroluminescent panel; and metal layers disposed on the other surface of the contact piece in portions overlapping with the lands. These technical features are common to Aspects 1 to 6.

In the present invention, the organic electroluminescent panel preferably includes a pair of planar electrodes.

In the present invention, the electrical connection unit preferably includes a light-transmitting portion for transmission of light from the organic electroluminescent panel. With such a portion, the electrical connection unit can be composed of an opaque material, allowing the organic EL module to be manufactured at low cost.

In the present invention, the lands and the metal layers are preferably composed of the same material in order to reduce the difference between the coefficients of linear expansion of the two surfaces of the contact piece and to ensure a gap between the body and contact piece of the flexible substrate so that the organic EL module can be easy to manufacture.

In the present invention, contact electrodes are preferably disposed on the opposite side of the light-emitting side of the organic electroluminescent panel, and the lands of the contact piece are preferably electrically connected to the contact electrodes through an anisotropic conductive film, conductive paste, or metal paste. This ensures mechanical and electrical connection between the organic electroluminescent panel and the electrical connection unit.

The components of the present invention and embodiments implementing the present invention will now be described in detail. It should be noted that, throughout the specification, the term "to" indicating the numerical range is meant to be inclusive of the lower and upper limits represented by the numerals given before and after the term, respectively.

An organic EL module of the present invention includes an assembly of: an organic EL panel; and an electrical connection unit disposed on a light-emitting side of the organic EL panel, the electrical connection unit including: a flexible substrate including: a body disposed on the light-emitting side and periphery of the organic EL panel, and a contact piece defined by at least one cutout in the body and disposed on the opposite side to the light-emitting side of the organic EL panel; a capacitance sensing circuit disposed on one surface of the body; drive circuits disposed on the one surface of the body and configured to drive the organic EL panel; lands disposed on one surface of the contact piece and connecting the drive circuits to the organic EL panel; and metal layers disposed on the other surface of the contact piece in portions overlapping with the lands.

Before the description of the overall structure of the organic EL module, the structures of the organic EL panel and the electrical connection unit constituting the organic EL module will now be described with reference to the drawings.

In the present invention, the organic EL element is a light-emitting element composed of a pair of electrodes and two or more organic functional layers; the organic EL panel includes the organic EL element sealed on a substrate with a resin or other sealants and has a pair of extraction electrodes; and the organic EL module includes the organic EL panel and the electrical connection unit connected to each other through the extraction electrodes, the electrical connection unit including the drive circuits (for driving the organic EL panel) and the capacitance sensing circuit.

<Organic Electroluminescent Panel>

An organic EL panel 10 will be described referring to FIGS. 1A, 1B and 2.

Figure 1A:
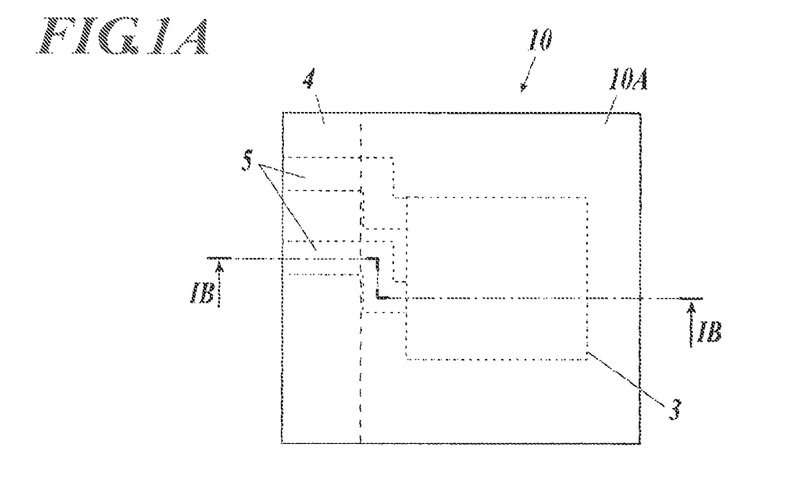
FIG. 1A is a schematic top view illustrating an exemplary structure of an organic electroluminescent panel for an organic electroluminescent module.
Figure 1B:
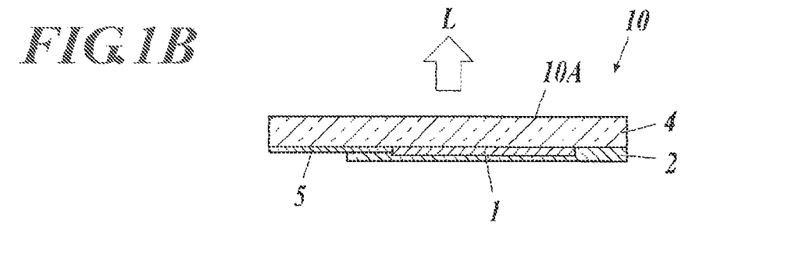
FIG. 1B is an arrow cross-sectional view illustrating an exemplary structure of an organic electroluminescent panel for an organic electroluminescent module.

FIGS. 1A and 1B are schematic views illustrating an exemplary structure of the organic EL panel 10 for an organic EL module 100. FIG. 1A is a schematic top view of the organic EL panel 10 viewed from the light-emitting surface 10A side. FIG. 1B is a cross-sectional arrow view taken along line IB-IB in FIG. 1A. FIG. 2 is a schematic cross-sectional view illustrating an exemplary structure of the organic EL panel 10.

The organic EL panel 10 includes an organic EL element 1 provided with a light-emitting region 3, a transparent substrate 4 supporting the organic EL element 1, and a sealant 2 sealing the organic EL element 1 on the transparent substrate 4. Contact electrodes 5 are extracted from the edge of the organic EL element 1 and connected to lands 24 of an electrical connection unit 20 through a conductive adhesive 8 (described below). The organic EL panel 10 in FIGS. 1A and 1B is a single-sided organic EL panel that emits light through the transparent substrate 4. The transparent substrate 4 has one surface on which the organic EL element 1 is disposed and the opposite surface (light-emitting surface 10A) from which emitted light L emerges.

Figure 2:
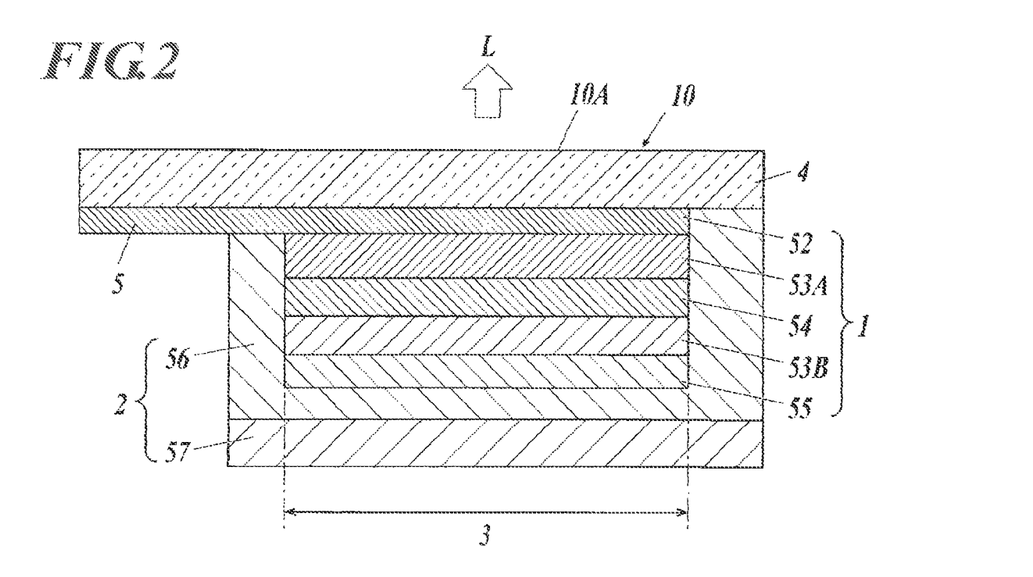
FIG. 2 is a schematic cross-sectional view illustrating an exemplary structure of an organic electroluminescent element for the organic electroluminescent panel.

Referring to FIG. 2, the organic EL element 1 is a laminate of an anode 52, a first organic functional layer group 53A, a luminous layer 54, a second organic functional layer group 53B, and a cathode 55. The laminate functions as a light-emitting region 3. The first organic functional layer group 53A includes a hole injection layer and a hole transport layer, for example. The second organic functional layer group 53B includes an electron transport layer and an electron injection layer, for example. The anode 52 extends to an edge of the transparent substrate 4 and serves as contact electrodes 5. The organic layers in the organic EL element 1 are sealed with a sealing adhesive 56 and the work is covered with a sealant 57 that minimizes intrusion of gases (including oxygen and moisture) which degrade the organic layers. Since the organic EL panel 10 is a single-sided panel emitting light through the transparent substrate 4, it is preferred that the transparent substrate 4, the anode 52, and the first organic functional layer group 53A be composed of a highly light-transmissive material such that light is efficiently extracted from the light-emitting surface 10A.

The details of the components of the organic EL element 1 and a method of manufacturing the same will be described later.

<Electrical Connection Unit>

The electrical connection unit 20 will now be described with reference to FIGS. 3A, 3B, 4A and 4B.

Figure 3A:
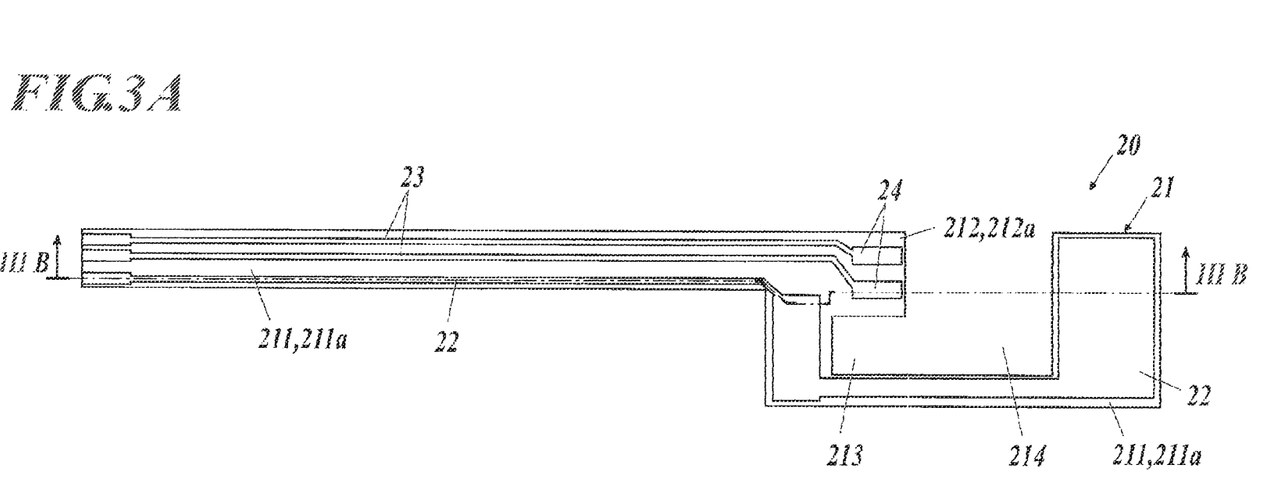
FIG. 3A is a schematic top view illustrating an exemplary structure of an electrical connection unit.
Figure 3B:
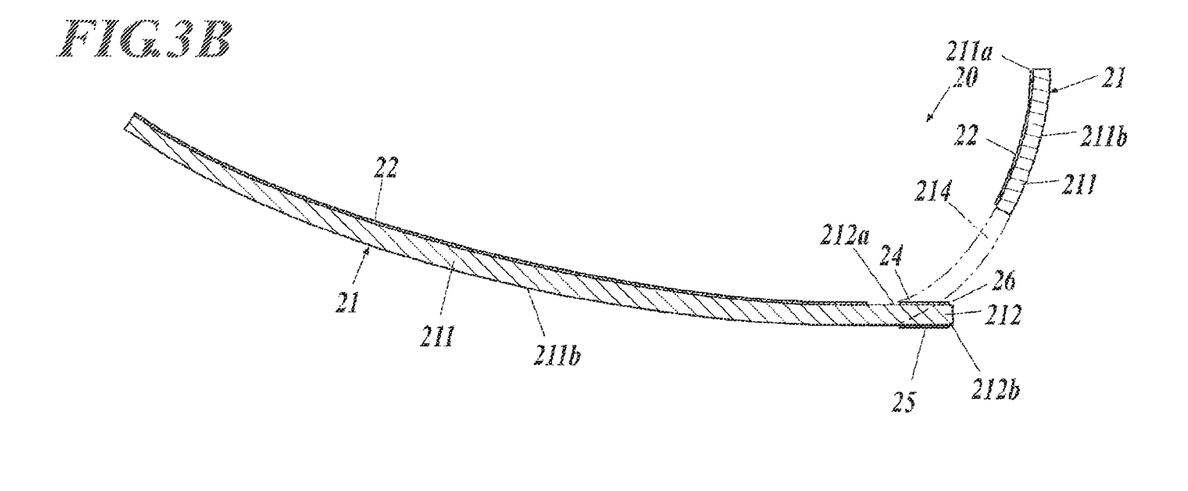
FIG. 3B is an arrow cross-sectional view illustrating an exemplary structure of an electrical connection unit.
Figure 4A:
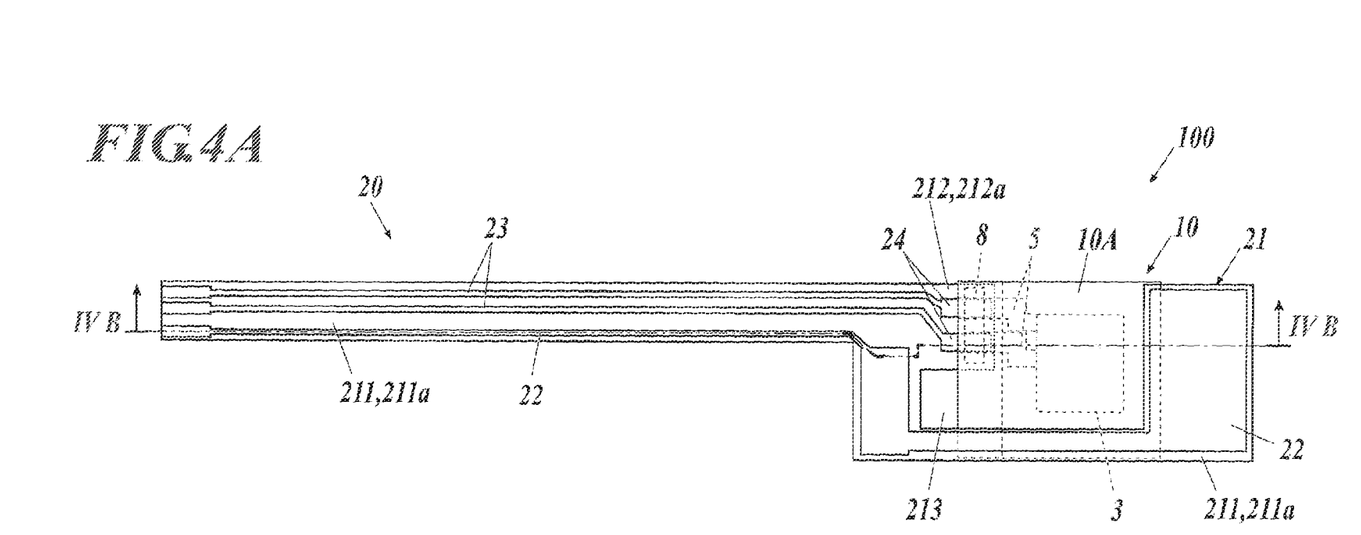
FIG. 4A is a schematic top view illustrating an exemplary structure of an organic electroluminescent module of the present invention.
Figure 4B:
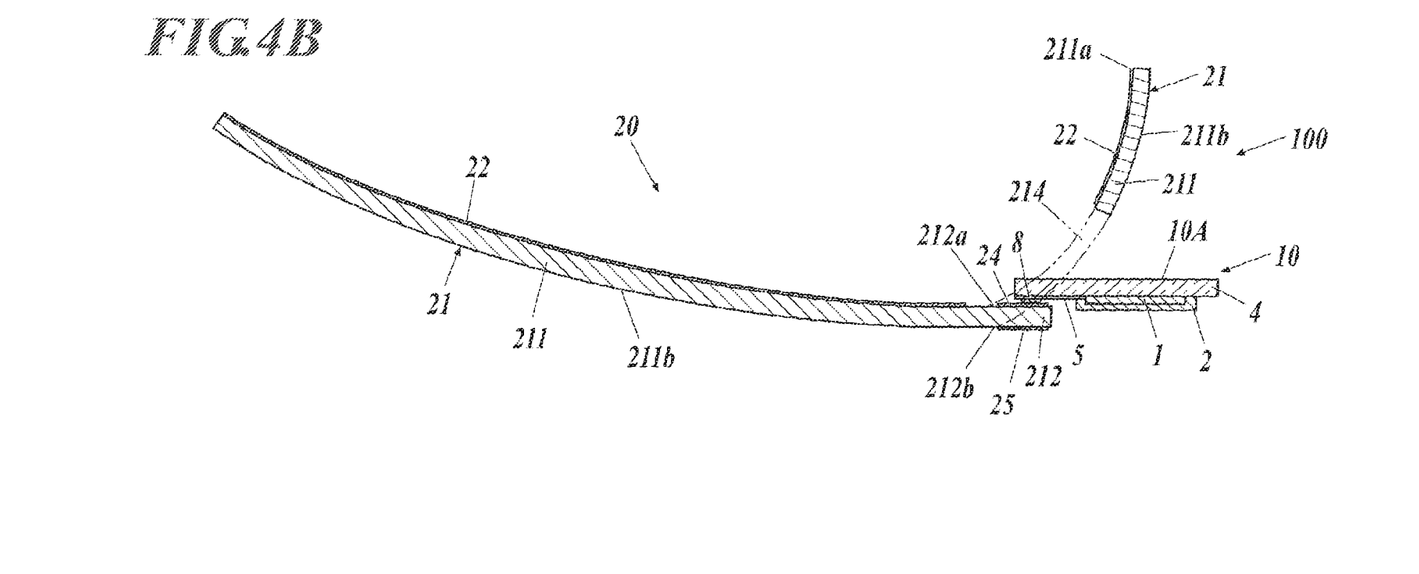
FIG. 4B is an arrow cross-sectional view illustrating an exemplary structure of an organic electroluminescent module of the present invention.

FIG. 3A is a schematic top view of the electrical connection unit 20 and FIG. 3B is an arrow cross-sectional view along line IIIB-IIIB in FIG. 3A. FIGS. 4A and 4B illustrate an organic EL module 100 including the electrical connection unit 20 in FIGS. 3A and 3B and an organic EL panel 10 thereon. FIG. 4A is a schematic top view of the organic EL module 100, and FIG. 4B is an arrow cross-sectional view along line IVB-IVB in FIG. 4A. The electrical connection unit 20 is partly curled in a normal state as shown in FIGS. 3B and 4B. FIGS. 3A and A illustrate the electrical connection unit 20 that is temporarily planarized by force, for convenience sake.

The electrical connection unit 20 includes a flexible substrate 21, a sensing circuit 22, drive circuits 23, lands 24, and metal layers 25.

The flexible substrate 21 includes a body 211 and a contact piece 212 defined by a cutout 213 in the body 211. This design allows the body 211 to be disposed on the light-emitting surface 10A side and the periphery of the organic EL panel 10, and the contact piece 212 to be disposed remote from the light-emitting surface 10A of the organic EL panel 10. One surface 211a of the body 211 and one surface 212a of the contact piece 212 are continuous, and the other surface 211b of the body 211 and the other surface 212b of the contact piece 212 are continuous.

The flexible substrate 21 has a region which overlaps with the organic EL panel 10 and which is provided with an opening (a light-transmitting portion 214) continuous with the cutout 213. Light L emitted from the organic EL panel 10 travels upward and passes through the flexible substrate 21 via the light-transmitting portion 214.

The flexible substrate 21 is composed of any flexible resin material with adequate mechanical strength. Examples of such a material include polyimide (PI) resins, polycarbonate resins, poly(ethylene terephthalate) (PET) resins, poly(ethylene naphthalate) (PEN) resins, and cyclo-olefin polymer (COP) resins. Preferred examples include polyimide (PI) resins, poly(ethylene terephthalate) (PET) resins, and poly(ethylene naphthalate) (PEN) resins. A Typical example is highly heat-resistant polyimide resins which can withstand thermal treatment in the electrode mounting process.

The sensing circuit 22 is a lead line unit for capacitive touch sensing disposed on the surface 211a of the body 211 of the flexible substrate 21. Specifically, the sensing circuit 22 surrounds the light-transmitting portion 214 on the surface 211a and senses touch on the periphery of the light-emitting region 3 of the organic EL panel 10.

The sensing circuit 22 is composed of a conductive metal material, e.g., gold, silver, copper, or ITO. Among these, copper is preferred in view of cost reduction.

Each drive circuit 23 is a lead line unit for connection between the organic EL panel 10 and a drive IC (now shown) and disposed on the surface 211a of the body 211 of the flexible substrate 21. Examples of the material for the drive circuits 23 are the same as those of the material for the sensing circuit 22.

The lands 24, which provide connection between the drive circuits 23 and the organic EL panel 10, are disposed on the surface 212a of the contact piece 212 of the flexible substrate 21, and are continuous with the respective drive circuits 23. Examples of the material for the lands 24 are the same as those of the material for the drive circuits 23.

The metal layers 25 are disposed on the surface 212b of the contact piece 212 of the flexible substrate 21 and overlap the lands 24. The metal layers 25 are preferably composed of a material having substantially the same coefficient of linear expansion as the material for the lands 24. The metal layers 25 and the lands 24 are preferably composed of the same material.

In such an electrical connection unit 20, the sensing circuit 22 and the drive circuits 23 are not disposed on the surface 211b but only on the surface 211a of the body 211 of the flexible substrate 21. As described above, the flexible substrate 21, which is composed of a resin material, has a coefficient of linear expansion different from that of the sensing circuit 22 and the drive circuits 23, which are composed of a metal material. Hence, the surfaces 211a and 211b of the body 211 of the flexible substrate 21 have different coefficients of linear expansion. Thus, the finished electrical connection unit 20 curls in the body 211 of the flexible substrate 21 as shown in FIG. 3B.

The contact piece 212 of the flexible substrate 21 has the lands 24 on the surface 212a and the metal layers 25 on the surface 212b in portions overlapping with the lands 24. Hence, the surfaces 212a and 212b of the contact piece 212 of the flexible substrate 21 have an insignificant difference in coefficient of linear expansion, resulting in negligible curling in the contact piece 212 as shown in FIG. 3B.

The curled body 211 of the flexible substrate 21 and the uncurled contact piece 212 define a gap 26 therebetween in the electrical connection unit 20. The organic EL panel 10 can be mounted on the electrical connection unit 20 by insertion into the gap 26 without the step of bending the module at a boundary between the contact piece 212 and the body 211, leading to ready manufacturing of the organic EL module 100.

This structure ensures high accuracy of touch sensing at the same time because the sensing circuit 22 is disposed on the body 211 of the flexible substrate 21 and the body 211 is disposed adjacent to the light-emitting surface 10A and the periphery of the organic EL panel 10.

This structure also allows the sensing circuit 22 to be disposed near the light-emitting region 3 of the organic EL panel 10, the electrical connection unit 20 to be compact, and a small format to appear.

The electrical connection unit 20 described above has the sensing circuit 22, the drive circuits 23, the lands 24, and the metal layers 25 on the flexible substrate 21. The flexible substrate 21 may be provided with cover layers (not shown) on both sides so that the sensing circuit 22, the drive circuits 23, the lands 24, and the metal layers 25 can be protected from corrosion.

In the exemplary structure of FIGS. 3A and 3B, a part of the body 211 of the flexible substrate 21 has a substantially C shape surrounding the light-transmitting portion 214. Alternatively, this part of the body 211 may have a rectangular or circular shape surrounding the light-transmitting portion 214.

The light-transmitting portion 214 can be omitted provided that the flexible substrate 21 is composed of a transparent resin and the sensing circuit 22, the drive circuits 23, the lands 24, and the metal layers 25 are composed of a transparent metal (e.g., ITO) such that a portion of the electrical connection unit 20 is transparent which overlaps with the light-emitting region 3 of the organic EL panel 10.

The sensing circuit 22 and the drive circuits 23 are both disposed on the surface 211a of the body 211 of the flexible substrate 21. Alternatively, one of them may be disposed on the surface 211a of the body 211, provided that the two surfaces of the body 211 have different coefficients of linear expansion.

(Method of Fabricating Electrical Connection Unit)

The following explains an exemplary method of fabricating the electrical connection unit 20.

The method of fabricating the electrical connection unit 20 includes the steps of forming, on one surface of the flexible substrate 21, the capacitance sensing circuit 22, the drive circuits 23 configured to drive the organic EL panel 10, and the lands 24 for connecting the drive circuits 23 to the organic EL panel 10; forming the metal layers 25 on the other surface of the flexible substrate 21 in portions overlapping with the lands 24; and forming at least one cutout 213 on the periphery of the lands 24 of the flexible substrate 21 to form the body 211 including the sensing circuit 22 and the drive circuits 23 and the contact piece 212 including the lands 24 and the metal layers 25.

Specifically, fabrication of the electrical connection unit 20 employs a double-sided copper-clad board with a polyimide film serving as a flexible substrate 21. The double-sided copper-clad board is a 38-μm-thick polyimide film with 12-μm-thick copper layers on both sides, for example.

A conductive lead line pattern shown in FIG. 3A is formed on each copper layer. Specifically, the sensing circuit 22, the drive circuits 23, and the lands 24 are formed on one of the copper layers, while the metal layers 25 are formed on the other copper layer in the following manner.

A photoresist material is applied to or dry resist films are laminated on the copper layers on both sides of the polyimide film. The film is subjected to exposure through a mask for a desired lead line pattern, followed by development and then stripping of unnecessary portions of the resist, thereby forming a resist pattern.

The copper layers are then immersed in an etching solution or subjected to shower of the etching solution to form a desired lead line pattern.

Optionally, the both surfaces of the substrate 21 are coated by a cover layer for protection of each lead line pattern. For instance, the cover layer is a transparent polyethylene terephthalate) film applied to each surface of the lead line pattern via an adhesive layer by thermal lamination.

The cutout 213 and the light-transmitting portion 214 are formed, for example, with a pinnacle die. This process provides the body 211 having the sensing circuit 22 and the drive circuits 23 and the contact piece 212 having the lands 24 and the metal layers 25.

The electrical connection unit 20 can be thereby fabricated.

As shown in FIG. 3B, the finished electrical connection unit 20 curls in the body 211 of the flexible substrate 21. The two surfaces of the body 211 have different coefficients of linear expansion. The curling results from heating of the polyimide film and the copper layers of the body 211 during any of the steps of the fabrication process.

In this fabrication process, the cutout 213 defining the body 211 and the contact piece 212 is formed after providing the sensing circuit 22, the drive circuits 23, the lands 24, and the metal layers 25 on the flexible substrate 21. Alternatively, the cutout 213 defining the body 211 and the contact piece 212 may be preliminarily provided in the flexible substrate 21 before providing the sensing circuit 22, the drive circuits 23, the lands 24, and the metal layers 25 on the flexible substrate 21.

<Organic Electroluminescent Module>

The organic EL module 100 of the present invention includes an assembly of the organic EL panel 10 and the electrical connection unit 20. The body 211 of the flexible substrate 21 in the electrical connection unit 20 is disposed adjacent to the light-emitting surface 10A and the periphery of the organic EL panel 10. The contact piece 212 of the flexible substrate 21 is disposed remote from the light-emitting surface 10A of the organic EL panel 10. The surface 212a of the contact piece 212 faces the opposite side of the organic EL panel 10. The lands 24 on the surface 212a is connected to the contact electrodes 5 of the organic EL panel 10. Specifically, the organic EL panel 10 and the electrical connection unit 20 are connected in the manner shown in FIG. 4B.

Preferably, the organic EL panel 10 and the electrical connection unit 20 are connected through the conductive adhesive 8. The conductive adhesive 8 may be an anisotropic conductive film (ACF), metal paste, or any other adhesive.

The anisotropic conductive film is composed of a mixture of a thermosetting resin and conductive nanoparticles, for example. The conductive nanoparticles may be metal particles, metallised resin particles, or any other particles selected as appropriate. Commercially available cold-setting anisotropic conductive films (e.g., MF-331 from Hitachi Chemical Co., Ltd.) can also be used which are applicable to resin films.

Examples of the metal particles include nickel, cobalt, silver, copper, gold, and palladium particles. They may be used alone or in combination. Preferred are nickel, silver, and copper. To prevent surface oxidation of the particles, the particles may be coated with gold or palladium. The particles may be provided with metal protrusions or organic insulation coating on the surfaces.

The metallised resin particles are composed of resin cores coated with nickel, copper, gold, or palladium, for example. The metallised resin particles may be resin cores having outermost surfaces of gold or palladium. The resin cores may be provided with metal protrusions or organic insulation coating on the surfaces.

The metal paste may be commercially available metal nanoparticle paste, such as silver particle paste, silver-palladium particle paste, gold particle paste, and copper particle paste selected as appropriate. Examples of the metal paste include silver pastes for organic EL element substrates, such as CA-6178, CA-6178B, CA-2500E, CA-2503-4, CA-2503N, and CA-271 (specific resistance: 15-30 mΩ·cm, screen printing, cure temperature: 120-200° C.), from DAI-KEN CHEMICAL CO., LTD; pastes for LTCC, such as PA-88(Ag), TCR-880(Ag), and PA-Pt(Ag.Pt); and silver pastes for glass substrates, such as US-201 and UA-302 (firing temperature: 430-480° C.).

A method of manufacturing the organic EL module 100 will now be described.

A method of manufacturing an organic EL module of the present invention includes the steps of: forming, on one surface of the flexible substrate 21, a capacitance sensing circuit 22, drive circuits 23 configured to drive the organic EL panel 10, and lands 24 connecting the drive circuits 23 to the organic EL panel 10; forming metal layers 25 on the other surface of the flexible substrate 21 in portions overlapping with the lands 24; fabricating the electrical connection unit 20 by providing at least one cutout 213 on the periphery of the lands 24 of the flexible substrate 21, the cutout 213 defining a body 211 including the sensing circuit 22 and the drive circuits 23 and a contact piece 212 including the lands 24 and the metal layers 25; sliding the organic EL panel 10 in the surface direction of the contact piece into a gap between the body 211 and the contact piece 212 of the flexible substrate 21; and bonding contact electrodes 5 of the organic EL panel 10 to the contact piece 212 of the electrical connection unit 20 by thermal compression.

The method will now be explained more in detail. The electrical connection unit 20 is fabricated by the above-described method of fabricating the electrical connection unit. The organic EL panel 10 is prepared which has the conductive adhesive 8 temporarily provided on the contact electrodes 5.

The organic EL panel 10 is located such that its end on the contact electrodes 5 faces the gap 26 between the body 211 and the contact piece 212 of the prepared electrical connection unit 20. At this time, the organic EL panel 10 is substantially parallel to the contact piece 212 and the surface 212a of the contact piece 212 and the light-emitting surface 10A of the organic EL panel 10 face the same direction.

The organic EL panel 10 is slid toward the gap 26 in the surface direction of the contact piece between the body 211 and the contact piece 212. Sliding of the organic EL panel 10 is continued until the light-emitting region 3 of the organic EL panel 10 is disposed in the light-transmitting portion 214 of the electrical connection unit 20 and the contact electrodes 5 of the organic EL panel 10 is arranged opposite to the lands 24 of the electrical connection unit 20. Consequently, the body 211 of the electrical connection unit 20 is disposed adjacent to the light-emitting surface 10A and the periphery of the organic EL panel 10, and the contact piece 212 is disposed remote from the light-emitting surface 10A of the organic EL panel 10.

The contact electrodes 5 of the organic EL panel 10 and the lands 24 of the contact piece 212 in the electrical connection unit 20 are bonded by thermal compression through the conductive adhesive 8 for mechanical and electrical connection between the contact electrodes 5 and the respective lands 24. At this time, the compression is applied to the lands 24 through the metal layers 25 which are formed on the surface 212b of the contact piece 212 in portions overlapping with the lands 24. This allows effective application of pressure to the lands 24, facilitating connection between the contact electrodes 5 and the respective lands 24.

The contact electrodes 5 and the respective lands 24 may be connected by any means that can provide mechanical and electrical connection between them, instead of the conductive adhesive 8.

Thus, the organic EL module 100 can be manufactured.

<Structure of Organic Electroluminescent Element and Method of Manufacturing the Same>

As shown in FIG. 2, the organic EL element 1 in the organic EL panel 10 is a laminate including, in sequence, the transparent substrate 4, the anode 52, the first organic functional layer group 53A, the luminous layer 54, the second organic functional layer group 53B, and the cathode 55. The first organic functional layer group 53A includes, for example, a hole injection layer, a hole transport layer, and an electron blocking layer, while the second organic functional layer group 53B includes, for example, a hole blocking layer, an electron transport layer, and an electron injection layer. The first organic functional layer group 53A and the second organic functional layer group 53B may each have a single-layer structure. The first organic functional layer group 53A and the second organic functional layer group 53B are optional.

The following describes a typical structure of the organic EL element.
(i) Anode/hole injection-transport layer/luminous layer/electron injection-transport layer/cathode
(ii) Anode/hole injection-transport layer/luminous layer/hole blocking layer/electron injection-transport layer/cathode
(iii) Anode/hole injection-transport layer/electron blocking layer/luminous layer/hole blocking layer/electron injection-transport layer/cathode
(iv) Anode/hole injection layer/hole transport layer/luminous layer/electron transport layer/electron injection layer/cathode
(v) Anode/hole injection layer/hole transport layer/luminous layer/hole blocking layer/electron transport layer/electron injection layer/cathode
(vi) Anode/hole injection layer/hole transport layer/electron blocking layer/luminous layer/hole blocking layer/electron transport layer/electron injection layer/cathode The organic EL element 1 may further include a non-light-emitting intermediate layer. The intermediate layer may be a charge generating layer or a structure composing of a multiphoton unit.

For the summary of the organic EL element applicable to the present invention, refer to Japanese Unexamined Patent Application Publication Nos. 2013-157634, 2013-168552, 2013-177361, 2013-187211, 2013-191644, 2013-191804, 2013-225678, 2013-235994, 2013-243234, 2013-243236, 2013-242366, 2013-243371, 2013-245179, 2014-003249, 2014-003299, 2014-013910, 2014-017493, and 2014-017494, for example.

The layers in the organic EL element will now be described.

[Transparent Substrate]

The transparent substrate in the organic EL element of the present invention may be composed of any transparent material, such as glass and plastic materials. Preferred examples of the transparent substrate include glass, quartz, and resin films.

Examples of the glass material include silica glass, soda-lime silica glass, lead glass, borosilicate glass, alkali-free glass. The surface of the glass material may be optionally subjected to physical treatment (e.g., polishing) or covered with a coating film of an inorganic or organic material or with a hybrid coating film consisting of two or more such coating films in order to improve adhesion with the adjacent layer, durability, and uniformity.

Examples of the material for the resin film include polyesters, such as poly(ethylene terephthalate) (PET) and poly(ethylene naphthalate) (PEN); cellulose esters, such as polyethylene, polypropylene, cellophane, cellulose diacetate, cellulose triacetate (TAC), cellulose acetate butyrate, cellulose acetate propionate (CAP), cellulose acetate phthalate, cellulose nitrate, and derivatives thereof; miscellaneous polymers, such as poly(vinylidene chloride), poly(vinyl alcohol), poly(ethylene-vinyl alcohol), syndiotactic polystyrene, polycarbonates, norbornene resins, polymethylpentene, polyether ketones, polyimides, polyether sulfones (PESs), poly(phenylene sulfide), polysulfones, polyether imides, polyether ketone imides, polyamides, fluoropolymers, nylons, poly(methyl methacrylate), acrylics, and polyarylates; and cycloolefin resins, such as ARTON (product name; manufactured by JSR) and APEL (product name; manufactured by Mitsui Chemicals, Inc.).

For the organic EL element, an optional gas barrier layer may be applied to the transparent substrate.

The gas barrier layer may be composed of any material that can block moisture, oxygen, and other substances causing degradation of the organic EL element. Examples of such a material include inorganic materials, such as silicon oxide, silicon dioxide, and silicon nitride. The gas barrier layer is preferably a multilayer consisting of such an inorganic layer and an organic layer (of any organic material) in order to improve the durability of the gas barrier layer. These inorganic and organic layers may be laminated in any order, preferably alternate two or more times.

[Anode]

Examples of the material for the anode of the organic EL element include metals, such as Ag, Au, and the alloy thereof, CuI, indium-tin composite oxide (ITO), and metal oxides, such as $SnO_2$ and ZnO. Preferred are silver and the alloy of silver.

Examples of the alloy of silver for the anode include silver-magnesium (Ag—Mg), silver-copper (Ag—Cu), silver-palladium (Ag—Pd), silver-palladium-copper (Ag—Pd—Cu), and silver-indium (Ag—In).

For the organic EL element of the invention, the anode is preferably transparent and mainly composed of silver. In the invention, the anode mainly composed of silver has a silver content of 60 mass % or more, preferably 80 mass % or more, more preferably 90 mass % or more, more preferably 98 mass % or more. The transparent anode refers to that with a transmittance of 50% or more of light with a wavelength of 550 nm.

The sheet resistance of the anode is preferably below several hundred ohms per square. The thickness of the anode depends on the material and is typically 5 nm to 1 μm, preferably 5 nm to 200 nm. When the anode is mainly composed of silver, the anode has a thickness of preferably 2 nm to 20 nm, more preferably 4 nm to 12 nm. An anode with a thickness of 20 nm or less slightly absorbs and reflects the components in the emitted light, which ensures excellent light transmission.

If the anode is mainly composed of silver in the present invention, the base layer is preferably provided below the anode to form a uniform silver layer. The base layer may be composed of any material and preferably contains a nitrogen- or sulfur-containing organic compound. The base layer is preferably overlaid by the silver layer.

[Luminous Layer]

The luminous layer in the organic EL element preferably contains a phosphorescent compound.

The luminous layer emits light by recombination of electrons from the electrode or electron transport layer and holes from the hole transport layer. The light may appear either in the luminous layer or at the interface between the luminous layer and the adjacent layer.

The luminous layer may have any structure provided that it contains a luminescent material that meets the requirements for light emission. The luminous layer may be composed of multiple layers that have the same emission spectrum and maximum emission wavelength. In this case, a non-light-emitting intermediate layer is preferably disposed between the adjacent luminous layers.

The cumulative thickness of the luminous layer is preferably 1-100 nm and more preferably, for lower drive voltage, 1-30 nm. The cumulative thickness of the luminous layer includes the thickness of the non-light emitting intermediate layer(s) optionally provided between the adjacent luminous layers.

The luminescent material and host compound in the luminous layer described below can be formed by a known method, such as vacuum deposition, spin coating, casting, a Langmuir Blodgett (LB) technique, or an inkjet technique.

The luminous layer may contain a mixture of multiple luminescent materials, for example, a mixture of a phosphorescent material and a fluorescent material (also referred to as fluorescent dopant or fluorescent compound). Preferably, the luminous layer contains a host compound (also referred to as emission host) and a luminescent material (also referred to as luminescent dopant compound) which emits light.

(1) Host Compound

The host compound contained in the luminous layer is preferably a compound having a phosphorescence quantum yield of phosphorescent emission of less than 0.1 at room temperature (25° C.), more preferably less than 0.01. The volume proportion of the compound in the luminous layer is preferably 50% or more.

The host compound may be a known host compound or a combination of known host compounds. The use of a plurality of host compounds can control the transportation of charge and can enhance the efficiency of the organic EL element. Furthermore, use of a plurality of luminescent materials described below allows mixture of different luminous colors and thus generation of any intended emission color.

The host compound in the luminous layer may be a known low-molecular-weight compound, a high-molecular-weight compound having a repeating unit, or a low-molecular-weight compound having polymerizable group such as a vinyl group or an epoxy group (vapor deposition polymerizable luminescent host).

The host compounds described in the following documents are applicable to the present invention: Japanese Unexamined Patent Application Publication Nos. 2001-257076, 2001-357977, 2002-8860, 2002-43056, 2002-105445, 2002-352957, 2002-231453, 2002-234888, 2002-260861, 2002-305083, U.S. Patent application publication Nos. 2005/0112407 and 2009/0030202, WO2001/039234, WO2008/056746, WO2005/089025, WO2007/063754, WO2005/030900, WO2009/086028, WO2012/023947, Japanese Unexamined Patent Application Publication No. 2007-254297, and EP Patent No. 2034538, for example.

(2) Luminescent Material

Examples of the luminescent material that can be used in the present invention include phosphorescent compounds (also referred to as phosphorescent material or phosphorescent dopant) and fluorescent compounds (also referred to as fluorescent material).

(2.1) Phosphorescent Compound

The phosphorescent compound emits light from an excited triplet state, specifically, emits phosphorescent light at room temperature (25° C.) and is defined as a compound having a phosphorescence quantum yield of 0.01 or more at 25° C. The phosphorescence quantum yield is preferably 0.1 or more.

The phosphorescence quantum yield can be measured by the method described in page 398 of Bunkoh II of Dai 4 Han Jikken Kagaku Koza 7 (Spectroscopy II of the 4th Series of Experimental Chemistry 7) (1992, published by Maruzen Co., Ltd.). In the measurement of the phosphorescence quantum yield in a solution, various solvents can be used. The only requirement for the phosphorescent compound according to the present invention is to achieve the above-mentioned phosphorescence quantum yield of 0.01 or more in any appropriate solvent.

The phosphorescent compound can be appropriately selected from known compounds that are used in the luminous layers of common organic EL elements and is preferably a complex compound containing a metal belonging to any one of Groups 8 to 10 on the periodic table of elements, more preferably an iridium compound, an osmium compound, a platinum compound (platinum complex compound), or a rare earth complex, more preferably an iridium compound.

In the present invention, at least one luminous layer may contain two or more phosphorescent compounds. The concentration of the phosphorescent compounds in the luminous layer may vary in the thickness direction of the luminous layer.

The known phosphorescent compounds applicable to the present invention are those described in the following documents:

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO2009/100991, WO2008/101842, WO2003/040257, U.S. Patent application publication Nos. 2006/835469, 2006/0202194, 2007/0087321, 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO2009/050290, WO2009/000673, U.S. Pat. No. 7,332,232, U.S. Patent application publication No. 2009/0039776, U.S. Pat. No. 6,687,266, U.S. Patent application publication Nos. 2006/0008670 and 2008/0015355, U.S. Pat. No. 7,396,598, U.S. Patent application publication No. 2003/0138657, U.S. Pat. No. 7,090, 928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO2006/056418, WO2005/123873, WO2005/123873, WO2006/082742, U.S. Patent application publication No. 2005/0260441, U.S. Pat. No. 7,534,505, U.S. Patent application publication No. 2007/0190359, U.S. Patent Nos. 7,338,722 and 7,279,704, U.S. Patent application publication No. 2006/103874, WO2005/076380, WO2008/140115, WO2011/134013, WO2010/086089, WO2012/020327, WO2011/051404, WO2011/073149, Japanese Unexamined Patent Application Publication Nos. 2009-114086, 2003-81988, and 2002-363552.

In the present invention, the phosphorescent compound is preferably an organic metal complex containing an Ir central metal, more preferably a complex having at least one coordinate bond selected from the group consisting of a metal-carbon bond, a metal-nitrogen bond, a metal-oxygen bond, and a metal-sulfur bond.

The above-described phosphorescent compound (also referred to as phosphorescent metal complex) can be prepared in any of the synthetic processes disclosed in the following documents: Organic Letter, vol. 3, No. 16, pp. 2579-2581 (2001), Inorganic Chemistry, vol. 30, No. 8, pp. 1685-1687 (1991), J. Am. Chem. Soc., vol. 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry., vol. 26, p. 1171 (2002), and European Journal of Organic Chemistry, vol. 4, pp. 695-709 (2004); and the documents cited in these documents.

(2.2) Fluorescent Compound

Typical examples of the fluorescent compound include coumarin pigments, pyran pigments, cyanine pigments, croconium pigments, squalium pigments, oxobenzanthracene pigments, fluorescein pigments, rhodamine pigments, pyrylium pigments, perylene pigments, stilbene pigments, polythiophene pigments, and rare-earth complex phosphors.

[Injection Layers: Hole Injection Layer and Electron Injection Layer]

An injection layer is disposed between an electrode and a luminous layer to decrease the drive voltage and increase the luminance. The details of the injection layer is disclosed in "Yuki EL Soshi to Sono Kogyoka Saizensen (Organic EL Elements and their Advanced Industrialization)", Second Edition, Chapter II "Denkyoku Zairyo (Electrode Material)" (pp. 123-166) (published by N. T. S. Co., Ltd., on Nov. 30, 1998). In general, a hole injection layer can be disposed between an anode and a luminous layer or between an anode and a hole transport layer, and an electron injection layer can be disposed between a cathode and a luminous layer or between a cathode and an electron transport layer.

The details of the hole injection layer are described in Japanese Unexamined Patent Application Publication Nos. H9-45479, H9-260062, and H8-288069. Examples of the material for the hole injection layer include derivatives of porphyrin, phthalocyanine, oxazole, oxadiazole, triazole, imidazole, pyrazoline, pyrazolone, phenylenediamine, hydrazone, stilbene, polyarylalkane, triarylamine, carbazole, indolocarbazole, and isoindole; acene derivatives, such as anthracene and naphthalene; fluorene derivatives; fluorenone derivatives; polyvinylcarbazole; polymer and oligomer materials containing aromatic amines in their main or side chains; polysilanes; and conductive polymers and oligomers (e.g., polyethylenedioxythiophene (PEDOT), poly (styrene sulfonate) (PSS), aniline copolymers, polyaniline, and polythiophene).

Examples of triarylamine derivatives include benzidines, such as α-NPD (4,4'-bis[N-(1-naphthyl)-N-phenylamino] biphenyl); starburst compounds, such as MTDATA (4,4',4"-tris[N-(3-methylphenyl)-N-phenylamino]triphenylamine); and compounds containing triarylamine having a core bonded to fluorene or anthracene.

The hole injection layer may have any thickness, typically about 0.1-100 nm, preferably 2-50 nm, more preferably 2-30 nm.

The details of the electron injection layer are also described in Japanese Unexamined Patent Application Publication Nos. H6-325871, H9-17574, and H10-74586. Preferred examples of the material for the electron injection layer include metals, such as strontium and aluminum; alkali metal compounds, such as lithium fluoride, sodium fluoride, and potassium fluoride; magnesium halides, such as magnesium fluoride; alkaline earth metal halides, such as calcium fluoride; metal oxides, such as molybdenum trioxides and aluminum oxides; and metal complexes, such as lithium 8-hydroxyquinolate (Liq).

Preferably, the electron injection layer is a ultrathin film. The thickness of the electron injection layer is preferably 1 nm to 10 μm depending on the material.

[Hole Transport Layer]

The hole transport layer is composed of a hole transport material that has hole transportability. The hole injection layer and the electron blocking layer are categorized into the hole transport layer in a broad sense. The hole transport layer may have a single-layer or multilayer structure.

The hole transport materials have hole injecting or transporting ability or electron blocking ability, and may be either organic or inorganic materials. Examples of such materials include triazole, oxadiazole, imidazole, polyarylalkane, pyrazoline, pyrazolone, phenylenediamine, arylamine, amino-substituted chalcone, oxazole, styryl anthracene, fluorenone, hydrazone, stilbene, and silazane derivatives, aniline copolymers, and conductive high-molecular weight oligomers, and thiophene oligomers.

These materials can be used as hole transport materials. Further examples of preferred materials include porphyrin compounds, aromatic tertiary amine compounds, and styrylamine compounds, among which particularly preferred are aromatic tertiary amine compounds.

Typical examples of the aromatic tertiary amine compounds and the styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (abbreviated as "TPD"), 2,2-bis(4-di-p-tolylaminophenyl)propane, 1,1-bis (4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di (4-methoxyphenyl)-4,4'-diaminobiphenyl, N,N,N',N'-tetraphenyl-4,4'-diaminodiphenyl ether, 4,4'-bis (diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, and N-phenylcarbazole.

The hole transport layer is a thin film of the above-described hole transport material formed by any known deposition technique, for example, vacuum vapor deposition, spin coating, casting, printing such as an inkjet technique, or a Langmuir Blodgett (LB) technique. The hole transport layer may have any thickness, typically about 5 nm-5 µm, preferably 5-200 nm. The hole transport layer may have a single-layer structure composed of one or more of the materials mentioned above.

The hole transport layer may be composed of a material doped with an impurity for high p-type conductivity. Examples of such a hole transport layer include those described in Japanese Unexamined Patent Application Publication Nos. H4-297076, 2000-196140, 2001-102175, and J. Appl. Phys., 95, 5773 (2004).

In the present invention, such a hole transport layer with high p-type conductivity is preferably used to produce an element with low power consumption.

[Electron Transport Layer]

The electron transport layer is composed of a material having electron transportability, and the electron injection layer and the hole blocking layer are categorized into the electron transport layer in a broad sense. The electron transport layer may have a single-layer or multilayer structure.

In an electron transport layer having a single-layer or multilayer structure, the layer adjacent to the luminous layer is composed of an electron transport material (also serving as a hole blocking material) and should be capable of transporting electrons from the cathode to the luminous layer. The electron transport material can be selected from any known compounds, such as nitro-substituted fluorene, diphenylquinone, thiopyrandioxide, carbodiimide, fluorenylidenemethane, anthraquinodimethane, anthrone, and oxadiazole derivatives. Further examples of the material for the electron transport layer include thiadiazole (i.e., a ring in which an oxygen atom in the oxadiazole ring of the oxadiazole derivatives is replaced with a sulfur atom) derivatives, and quinoxaline derivatives having a quinoxaline ring known as an electron-withdrawing group. Polymer materials containing the above compounds introduced into their chains or polymer materials containing the above compounds as main chains can also be used.

Further examples of the material for the electron transport layer include metal complexes of 8-quinolinol derivatives, such as tris(8-quinolinol)aluminum (abbreviated as Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (abbreviated as Znq), and metal complexes formed by replacing the central metal of the above metal complexes with In, Mg, Cu, Ca, Sn, Ga or Pb.

The electron transport layer is a thin film of the above-described electron transport material formed by any known deposition technique, for example, vacuum vapor deposition, spin coating, casting, printing such as an inkjet technique, or a Langmuir Blodgett (LB) technique. The electron transport layer may have any thickness, typically about 5 nm to 5 µm, preferably 5 nm to 200 nm. The electron transport layer may have a single-layer structure composed of one or more of the materials mentioned above.

[Blocking Layers: Hole Blocking Layer and Electron Blocking Layer]

The blocking layers (the hole blocking layer and the electron blocking layer) may be optionally provided to the organic EL element, in addition to the above-described layers. Examples include a hole blocking layer described in detail in Japanese Laid-Open Patent Application Publication Nos. H11-204258 and H11-204359, and "Yuki EL soshi to sono kogyoka saizensen (Organic EL element and its frontier of industrialization)" (published by NTS Corporation, Nov. 30, 1998, page 237).

The hole blocking layer functions as an electron transport layer in a broad sense, and is composed of a hole blocking material which has electron transportability and has a very low hole transportability. The hole blocking layer transports electrons and blocks holes, resulting in an increased probability of recombination between the electrons and the holes. The structure of an electron transport layer may optionally be used for a hole blocking layer.

The hole blocking layer is preferably disposed adjacent to the luminous layer.

The electron blocking layer functions as a hole transport layer in a broad sense, and is composed of an electron blocking material which has hole transportability and has a very low electron transportability. The electron blocking layer transports holes and blocks electrons, resulting in an increased probability of recombination between the electrons and the holes. The structure of a hole transport layer may optionally be used for an electron blocking layer.

The hole blocking layer and the electron transport layer of the present invention preferably have a thickness within the range of 3 to 100 nm, more preferably within the range of 5 to 30 nm.

[Cathode]

The cathode is an electrode to supply holes to the organic functional layer group and the luminous layer and is composed of a metal, an alloy, an organic or inorganic conductive compound, or a mixture thereof. Specific examples of the material for the cathode include gold, aluminum, silver, magnesium, lithium, magnesium/copper mixtures, magnesium/silver mixtures, magnesium/aluminum mixtures, magnesium/indium mixtures, indium, lithium/aluminum mixtures, rare earth metals, and oxide semiconductors, such as ITO, ZnO, TiO$_2$, and SnO$_2$.

The cathode can be fabricated by forming any of these conductive materials into a thin film using any process, for example, vapor deposition or sputtering. The sheet resistance of the cathode is preferably several hundred ohms per square or lower. The thickness of the cathode is typically within the range of 5 nm to 5 µm, preferably within the range of 5 to 200 nm, depending on the material.

[Sealant]

Examples of the sealing means applicable to the organic EL element include sealants and adhesives for adhesion between the cathode and the transparent substrate.

The sealant is disposed to cover the display area of the organic EL element and may have a concave or flat shape. The transparency and electric insulation of the sealant are not particularly limited.

Specific examples of the sealant include glass plates, polymer plates and films, and metal plates and films. Examples of the material for the glass plate include soda-lime glass, barium-strontium-containing glass, lead glass, aluminosilicate glass, borosilicate glass, barium borosilicate glass, and quartz. Examples of the material for the polymer plate include polycarbonates, acrylics, polyethylene terephthalate), polyether sulfides, and polysulfones. Examples of the material for the metal plate include one or more metals or alloys selected from the group consisting of stainless steel, iron, copper, aluminum, magnesium, nickel, zinc, chromium, titanium, molybdenum, silicone, germanium and tantalum.

Preferred examples of the sealant are polymer films and metal films which contribute to production of low-profile organic EL element. The polymer film preferably has a water vapor permeability of $1\times10^{-3}$ g/(m$^2$·24 h) or lower measured at 25±0.5° C. and 90±2% RH by a method in accordance with JIS K 7129-1992, and more preferably an oxygen permeability of $1\times10^{-3}$ ml/m$^2$·24 h·atm (1 atm=1.01325×10$^5$ Pa) or lower and a water vapor permeability of $1\times10^{-3}$ g/(m$^2$·24 h) or lower measured at 25±0.5° C. and 90±2% RH by a method in accordance with JIS K 7126-1987.

The gap between the sealant and the display area (light-emitting region) of the organic EL element is preferably filled with an inactive gas, such as nitrogen gas and argon gas, or an inactive liquid, such as fluorohydrocarbon and silicon oil, for the purpose of forming a gaseous or a liquid phase. The gap may alternatively be a vacuum or filled with a moisture-absorbing compound.

[Intermediate Electrode Layer]

The organic EL element of the present invention may include, between the anode and the cathode, two or more organic functional units consisting of an organic functional layer group and a luminous layer. In this case, an intermediate electrode layer with an independent connection terminal for electrical connection is provided between the adjacent organic functional units.

[Method of Manufacturing Organic EL Element]

The organic EL element can be manufactured by depositing an anode, a first organic functional layer group, a luminous layer, a second organic functional layer group, and a cathode on a transparent substrate.

Specifically, a transparent substrate is prepared. An appropriate material for electrodes, e.g., anodes is formed into a thin film having a thickness of 1 μm or less, preferably in the range of 10 to 200 nm on the transparent substrate by vapor deposition, sputtering, or any other process. At the same time, contact electrodes for connection to an external source is formed at the edge of the anode.

A first organic functional layer group (which includes a hole injection layer and a hole transport layer), a luminous layer, a second organic functional layer group (which includes an electron transport layer) are deposited in sequence on the anode.

These layers are formed by, for example, spin coating, casting, an inkjet technique, vapor deposition, or printing, most preferably vacuum deposition or spin coating that readily provides homogeneous layers and minimizes the formation of pin holes. The layers may be formed by different techniques. Preferred conditions for the vapor deposition, which depend on the compound used, are a boat temperature in the range of 50 to 450° C., a vacuum in the range of $(1\times10^{-6})$ to $(1\times10^{-2})$ Pa, a deposition rate in the range of 0.01 to 50 nm/s, a substrate temperature in the range of −50 to 300° C., and a film thickness in the rage of 0.1 to 5 μm.

As described above, the first organic functional layer group, the luminous layer, and the second organic functional layer group are formed. The cathode is then formed by, for example, vapor deposition, sputtering, or any other appropriate technique. At this time, the cathode is insulated from the anode by the organic functional layer group and is patterned such that the terminal of the cathode is extracted from above the second organic functional layer group and resides on the periphery of the transparent substrate.

After the formation of the cathode, the transparent substrate, the anode, the first organic functional layer group, the luminous layer, the second organic functional layer group, and the cathode are sealed with a sealing material. Specifically, the sealing material is applied to the transparent substrate so as to cover at least the organic functional layer group, while the terminals of the anode and cathode are exposed.

Thus, the organic EL element can be manufactured.

EXAMPLES

The present invention will now be specifically described by examples, which should not be intended to limit the present invention.

The fabrication of the organic EL module in FIGS. 4A and 4B will now be described.

Organic EL panels cut into an appropriate size are temporarily arrayed in a tray. At this time, the light-emitting surface of each organic EL panel faces downward, while each contact electrode faces upward. Each organic EL panel is designed as illustrated in FIGS. 1A, 1B, and 2.

With an apparatus provided with a vacuum or electrostatic chuck system, each organic EL panel is chucked at the opposite surface to the light-emitting surface and transferred to the stage of an ACF (serving as a conductive adhesive) applier. For increased productivity, the organic EL panel is transferred under automatic control.

The organic EL panel is placed on the stage of the applier and is fixed on the stage with a vacuum chuck. An ACF drawn from the reel is disposed on the contact electrodes of the organic EL panel. The width of the ACF depends on the size of the organic EL panel and is in the range of 0.8 to 1.5 mm, for example. The drawn ACF is cut into an appropriate size and disposed on the contact electrodes of the organic EL panel. The ACF and the contact electrodes are temporarily bonded to each other with a heating tool at about 80° C. Exemplary pressure conditions for the heating tool are about 0.2 MPa and five seconds. After the temporary bonding, a separator is removed from the ACF.

The organic EL panel is transferred and temporarily disposed on the tray such that the light-emitting surface of the organic EL panel faces upward and the surface (the contact electrodes) having the temporary ACF faces downward. To prevent the surface having the temporary ACF from coming into contact with the tray, a region of the temporary tray which overlaps with the ACF has a concave surface.

A prepared electrical connection unit is disposed on a temporary stage. The electrical connection unit, which is designed as illustrated in FIG. 3A, includes a flexible substrate having a body provided with a sensing circuit and drive circuits on one side and a contact piece provided with lands and metal layers on two sides. Hence, the body of the electrical connection unit disposed on the temporary stage is entirely curled except for the planar contact piece, resulting in a gap between the contact piece and the body.

The contact piece is fixed on the temporary stage by suction while the lands of the contact piece of the electrical connection unit face upward. This causes the body of the electrical connection unit to curl so as to separate from the temporary stage, ensuring the gap between the contact piece and the body.

The organic EL panel is horizontally slid into the gap between the body and the contact piece, in the surface direction of the contact piece. Sliding of the organic EL panel is stopped when the contact electrodes of the organic EL panel are adjacent to the lands of the electrical connection unit and the light-emitting region of the organic EL panel is disposed in the light-transmitting portion of the electrical connection unit. A pressure of about 0.2 MPa is applied to the contact electrodes of the organic EL panel and the lands of the electrical connection unit from two sides to bring the ACF on the contact electrodes into tight contact with the lands. This allows the organic EL panel to be temporarily fixed to the electrical connection unit.

A temporary assembly of the organic EL panel and the electrical connection unit is transferred and fixed to a predetermined position of the stage of an FPC compressing machine. The compression is performed with a heating tool at about 130° C. at a pressure of about 1 to 2 MPa from two sides for 10 to 20 seconds. The thermal compression employs a heating tool having a shape that can apply pressure only to the lands of the FPC.

The organic EL module with high accuracy of touch sensing can be readily manufactured as described above.

The present U.S. patent application claims priority under the Paris Convention of Japanese Patent Application No. 2014-149602 filed on Jul. 23, 2014 the entirety of which is incorporated herein by reference.

What is claimed is:

1. An organic electroluminescent module comprising:
   an organic electroluminescent panel; and
   an electrical connection unit disposed on a light-emitting side of the organic electroluminescent panel, the electrical connection unit comprising:
      a flexible substrate comprising:
         a body disposed on the light-emitting side and periphery of the organic electroluminescent panel; and
         a contact piece defined by at least one cutout in the body and disposed on the opposite side to the light-emitting side of the organic electroluminescent panel;
      a capacitance sensing circuit disposed on one surface of the body;
      drive circuits disposed on the one surface of the body and configured to drive the organic electroluminescent panel;
      lands disposed on one surface of the contact piece and connecting the drive circuits to the organic electroluminescent panel; and
      metal layers disposed on the other surface of the contact piece in portions overlapping with the lands.

2. The organic electroluminescent module of claim 1, wherein the organic electroluminescent panel includes a pair of planar electrodes.

3. The organic electroluminescent module of claim 1, wherein the electrical connection unit includes a light-transmitting portion for transmission of light from the organic electroluminescent panel.

4. The organic electroluminescent module of claim 1, wherein the lands and the metal layers are composed of the same material.

5. The organic electroluminescent module of claim 1, further comprising:
   contact electrodes disposed on the opposite side to the light-emitting side of the organic electroluminescent panel, wherein
   the lands of the contact piece are connected to the respective contact electrodes through an anisotropic conductive film, conductive paste, or metal paste.

6. A method of manufacturing an organic electroluminescent module comprising:
   an organic electroluminescent panel; and
   an electrical connection unit disposed on a light-emitting side of the organic electroluminescent panel, the method comprising the steps of:
      forming, on one surface of the flexible substrate, a capacitance sensing circuit, drive circuits configured to drive the organic electroluminescent panel, and lands connecting the drive circuits to the organic electroluminescent panel;
      forming metal layers on the other surface of the flexible substrate in portions overlapping with the lands;
      fabricating the electrical connection unit by providing at least one cutout on the periphery of the lands of the flexible substrate, the cutout defining a body including the sensing circuit and the drive circuits and a contact piece including the lands and the metal layers;
      sliding the organic electroluminescent panel in the surface direction of the contact piece into a gap between the body and the contact piece of the flexible substrate; and
      bonding contact electrodes of the organic electroluminescent panel to the contact piece of the electrical connection unit by thermal compression.

* * * * *